United States Patent
Chen et al.

(10) Patent No.: US 10,505,023 B2
(45) Date of Patent: *Dec. 10, 2019

(54) STRUCTURE AND FORMATION METHOD OF SEMICONDUCTOR DEVICE STRUCTURE WITH A DUMMY FIN STRUCTURE

(71) Applicant: Taiwan Semiconductor Manufacturing Co., Ltd., Zhubei, Hsinchu (TW)

(72) Inventors: Lung Chen, Zhubei (TW); Kang-Min Kuo, Zhubei (TW); Wen-Hsin Chan, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/208,157

(22) Filed: Dec. 3, 2018

(65) Prior Publication Data

US 2019/0109206 A1    Apr. 11, 2019

Related U.S. Application Data

(63) Continuation of application No. 14/815,349, filed on Jul. 31, 2015, now Pat. No. 10,147,805.

(51) Int. Cl.
*H01L 29/66* (2006.01)
*H01L 29/78* (2006.01)
(Continued)

(52) U.S. Cl.
CPC .... *H01L 29/6681* (2013.01); *H01L 21/76232* (2013.01); *H01L 21/823431* (2013.01); *H01L 29/0653* (2013.01); *H01L 29/7851* (2013.01)

(58) Field of Classification Search
CPC ......... H01L 21/823821; H01L 29/6681; H01L 21/823431; H01L 29/66795; H01L 29/785;
(Continued)

(56) References Cited

U.S. PATENT DOCUMENTS 9,607,985 B1 * 3/2017 Tseng .................. H01L 27/0886
2007/0212649 A1   9/2007 Lalbahadoersing et al.
(Continued)

OTHER PUBLICATIONS http://www.mrsec.harvard.edu/education/ap298r2004/Erli%20chen%20Fabrication%20III%20-%20Etching.pdf, Applied Physics 298r, Apr. 12, 2004.
https://www.oxford-instruments.com/products/etching-deposition-and-growth/processes/etching-processes/silicon/si-hbr-etch.

*Primary Examiner* — Nduka E Ojeh
(74) *Attorney, Agent, or Firm* — Birch, Stewart, Kolasch & Birch, LLP

(57) ABSTRACT

Structures and formation methods of a semiconductor device structure are provided. The method includes forming a first fin structure and a second fin structure over a semiconductor substrate, and forming a mask layer covering the first fin structure and the second fin structure. The method also includes performing a first etching operation using the second fin structure as an etch stop layer to partially remove the mask layer such that the etch stop layer protrudes from the mask layer after the first etching operation. The method further includes partially removing the second fin structure using a second etching operation after the first etching operation.

20 Claims, 7 Drawing Sheets

(51) Int. Cl.
*H01L 29/06* (2006.01)
*H01L 21/762* (2006.01)
*H01L 21/8234* (2006.01)

(58) Field of Classification Search
CPC ........... H01L 21/7854; H01L 21/76232; H01L 29/0653; H01L 29/7851; H01L 2924/13067
USPC .......... 257/E21.409, E21.546, 506; 438/424, 438/443, 700
See application file for complete search history.

(56) References Cited

U.S. PATENT DOCUMENTS

| | | |
|---|---|---|
| 2013/0277759 A1* | 10/2013 | Chen ............... H01L 21/823431 257/397 |
| 2013/0309838 A1 | 11/2013 | Wei et al. |
| 2014/0011356 A1 | 1/2014 | Engelhardt |
| 2014/0117426 A1 | 5/2014 | Cho et al. |
| 2015/0206759 A1 | 7/2015 | Tsao et al. |
| 2015/0206954 A1* | 7/2015 | Lin ................... H01L 29/66795 257/365 |
| 2015/0378223 A1 | 12/2015 | Wen |
| 2016/0056045 A1 | 2/2016 | Huang et al. |
| 2016/0197075 A1 | 7/2016 | Li et al. |

\* cited by examiner

STRUCTURE AND FORMATION METHOD OF SEMICONDUCTOR DEVICE STRUCTURE WITH A DUMMY FIN STRUCTURE

CROSS REFERENCE TO RELATED APPLICATIONS

This application is a Continuation application of U.S. patent application Ser. No. 14/815,349, filed on Jul. 31, 2015, the entire of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
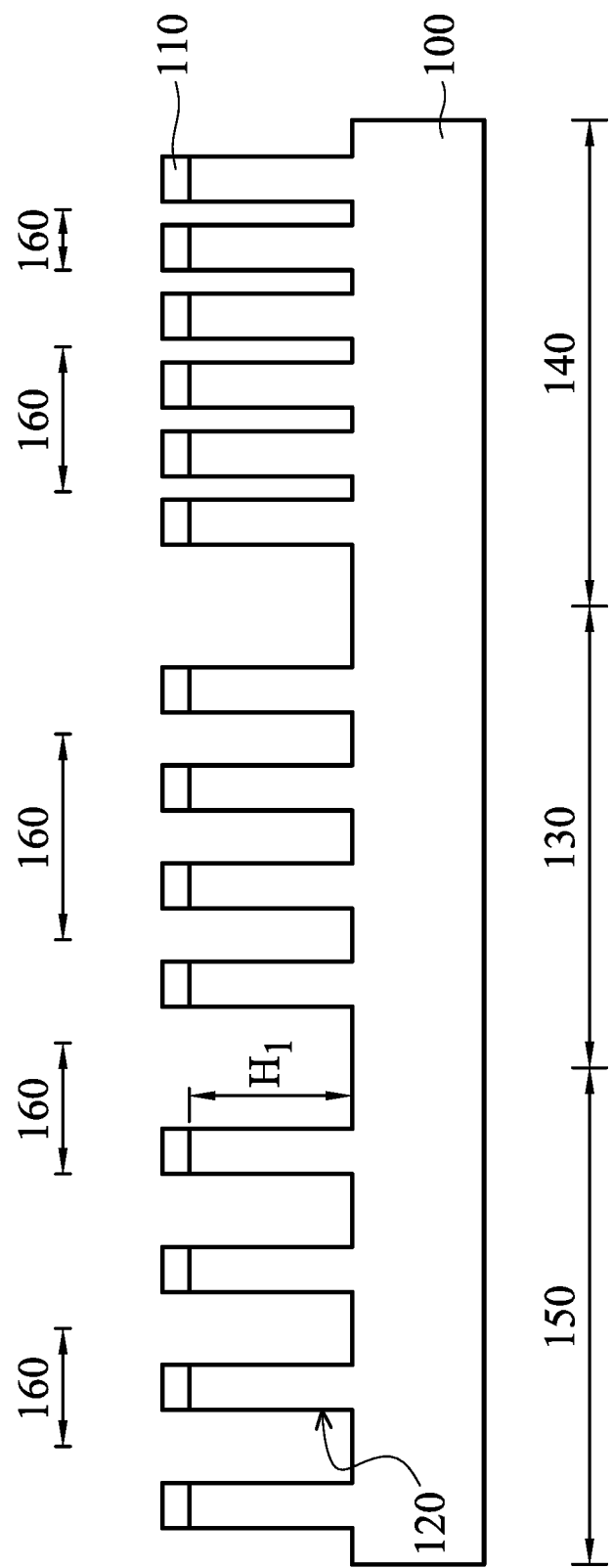
FIGS. 1A-1E are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1E are cross-sectional views of various stages of a process for forming a semiconductor device structure, in accordance with some embodiments. Additional operations can be provided before, during, and/or after the stages described in FIGS. 1A-1E. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, a patterned hard mask 110 is formed over the semiconductor substrate 100, in accordance with some embodiments. The patterned hard mask 110 has multiple openings that expose the semiconductor substrate 100. The semiconductor substrate 100 is partially removed through the openings of the patterned hard mask 110 to form multiple recesses (or trenches). One or more etching processes may be used to form the recesses. As a result, multiple fin structures are formed between the recesses. As shown in FIG. 1A, some of the fin structures (such as fin structures 120) are shown. In some embodiments, the fin structures 120 substantially have the same height. In some embodiments, the height $H_1$ of the fin structures 120 is in a range from about 120 nm to about 130 nm.

In some embodiments, the patterned hard mask 110 includes a first hard mask layer and a second hard mask layer. The first hard mask layer is positioned between the semiconductor substrate 100 and the second hard mask layer. In some embodiments, the first and second hard mask layers have different thicknesses. In some embodiments, the second hard mask layer is thicker than the first hard mask layer. In some embodiments, the first hard mask layer and the second hard mask layer are made of silicon nitride, silicon oxide, silicon carbide, metal nitrides such as titanium nitride and/or tantalum nitride, another suitable material, or a combination thereof. In some embodiments, the first hard mask layer is made of silicon nitride, and the second hard mask layer is made of silicon oxide. One or more additional hard mask layers can be added to the patterned hard mask 110.

For example, one or more material layers (mask layers) are deposited over the semiconductor substrate 100. Afterwards, a photoresist layer is deposited over the material layer(s) and is patterned by one or more photolithography processes. The patterned photoresist is used as an etching mask to pattern the material layer(s). As a result, the patterned hard mask 110 is formed. The patterned photoresist is subsequently removed.

As shown in FIG. 1A, a regular region 130, a dense region 140 and an isolation (ISO) region 150 are defined, in accordance with some embodiments. The interval between the fin structures 120 in the regular region 130 is greater than that in the dense region 140 and is less than that in the ISO region 150. In other words, the fin structures 120 in the dense region 140 have a concentrated arrangement in comparison with the regular region 130 and the ISO region 150. The fin structures 120 in the ISO region 150 have a sparse arrangement in comparison with the regular region 130 and the dense region 140. In some embodiments, a static random access memory (SRAM) or another suitable element is configured to be formed in the dense region 140. In some embodiments, a logic unit or another suitable element is configured to be formed in the ISO region 150.

In some embodiments, one or more fin structures 120 are dummy and will be cut in the following operations according to requirements. Therefore, fin-cut regions 160 are defined according to the fin structures 120 that are designed to be dummy. As shown in FIG. 1A, the regular region 130, the dense region 140 and the ISO region 150 include one or more fin-cut regions 160, in accordance with some embodiments.

Figure 1B:
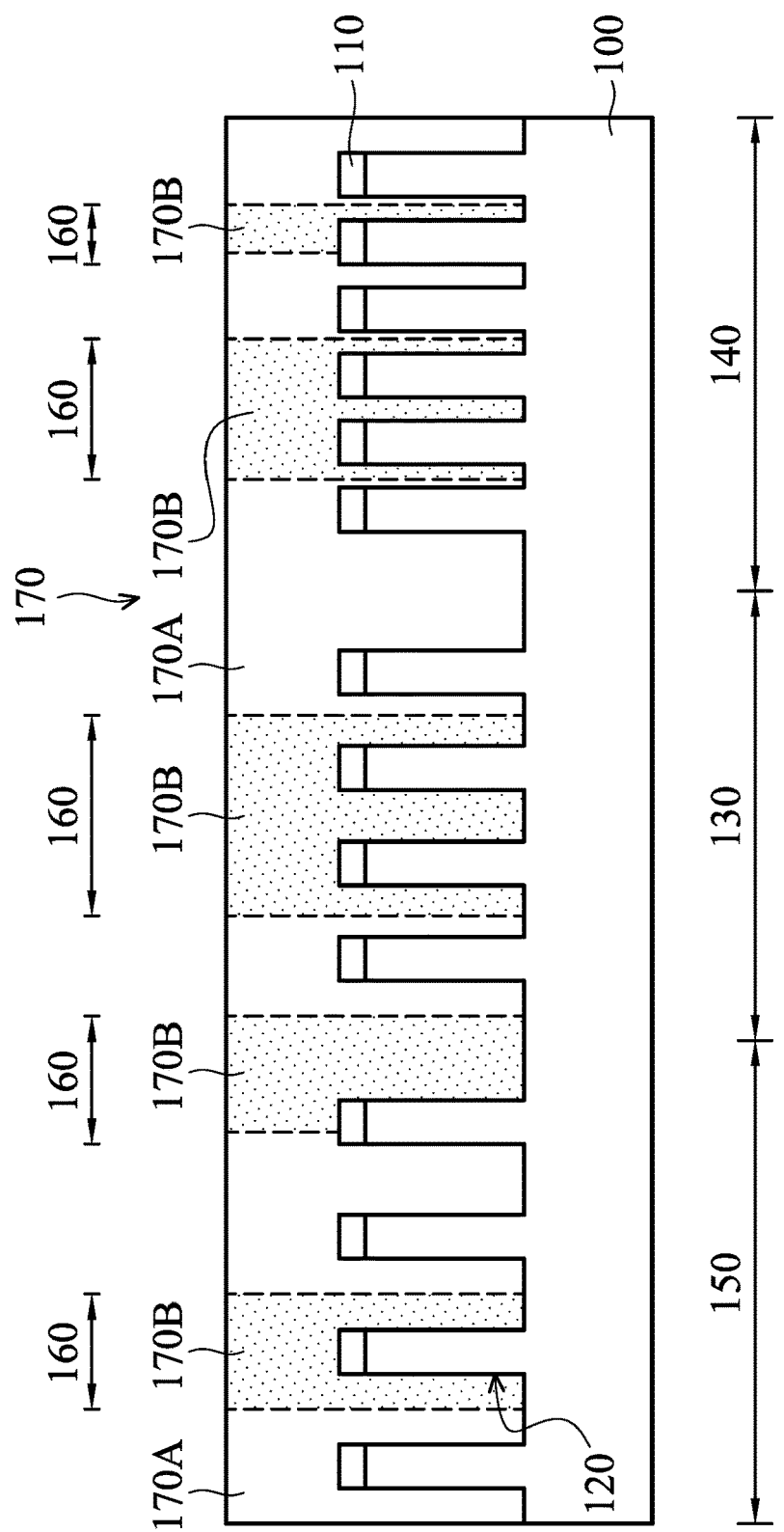

As shown in FIG. 1B, a mask layer 170 is deposited over the semiconductor substrate 100, in accordance with some embodiments. The mask layer 170 covers the patterned hard mask 110 and the fin structures 120. In some embodiments, the mask layer 170 is made of a photoresist material. The photoresist material may include a positive photoresist material or a negative photoresist material.

As shown in FIG. 1B, the mask layer 170 is irradiated (exposed) with a radiation beam through a photomask, in accordance with some embodiments. The photomask has a pattern corresponding to the fin-cut regions 160. Due to the exposure operation, the characteristics of the mask layer 170 in the fin-cut regions 160 have changed. In some embodiments, a solution (such as a developing solution) is applied on the mask layer 170 such that the mask layer 170 in the fin-cut regions 160 has characteristics that have changed even further. As a result, the mask layer 170 is divided into first portions 170A and second portions 170B.

The first portions 170A and the second portions 170B have different physical or chemical characteristics. The first portions 170A cover the top surface and the sidewalls of some of the fin structures 120. The second portions 170B correspond to the fin-cut regions 160 and cover the top surface and the sidewalls of some of the fin structures 120 that are designed to be dummy. In some embodiments, one of the second portions 170B is sandwiched between two first portions 170A. In some embodiments, one of the second portions 170B is surrounded by one of the first portions 170A.

In some cases, an overlay (OVL) shift or a misalignment may occur during the exposure of the mask layer 170. As shown in FIG. 1B, one of the second portions 170B in the dense region 140 may fail to accurately align to the corresponding fin-cut region 160. As a result, this second portion 170B fails to cover the sidewalls of the corresponding fin structure 120 that is designed to be dummy in the dense region 140. The corresponding fin structure 120 in the dense region 140 has one sidewall adjoining the first portion 170A. Similarly, one of the second portions 170B in the ISO region 150 may misalign to the corresponding fin-cut region 160. Consequently, the corresponding fin structure 120 that is designed to be dummy in the ISO region 150 has one sidewall contacting the first portion 170A. However, in some other embodiments, no OVL shift or misalignment occurs during the exposure of the mask layer 170.

Figure 1C:
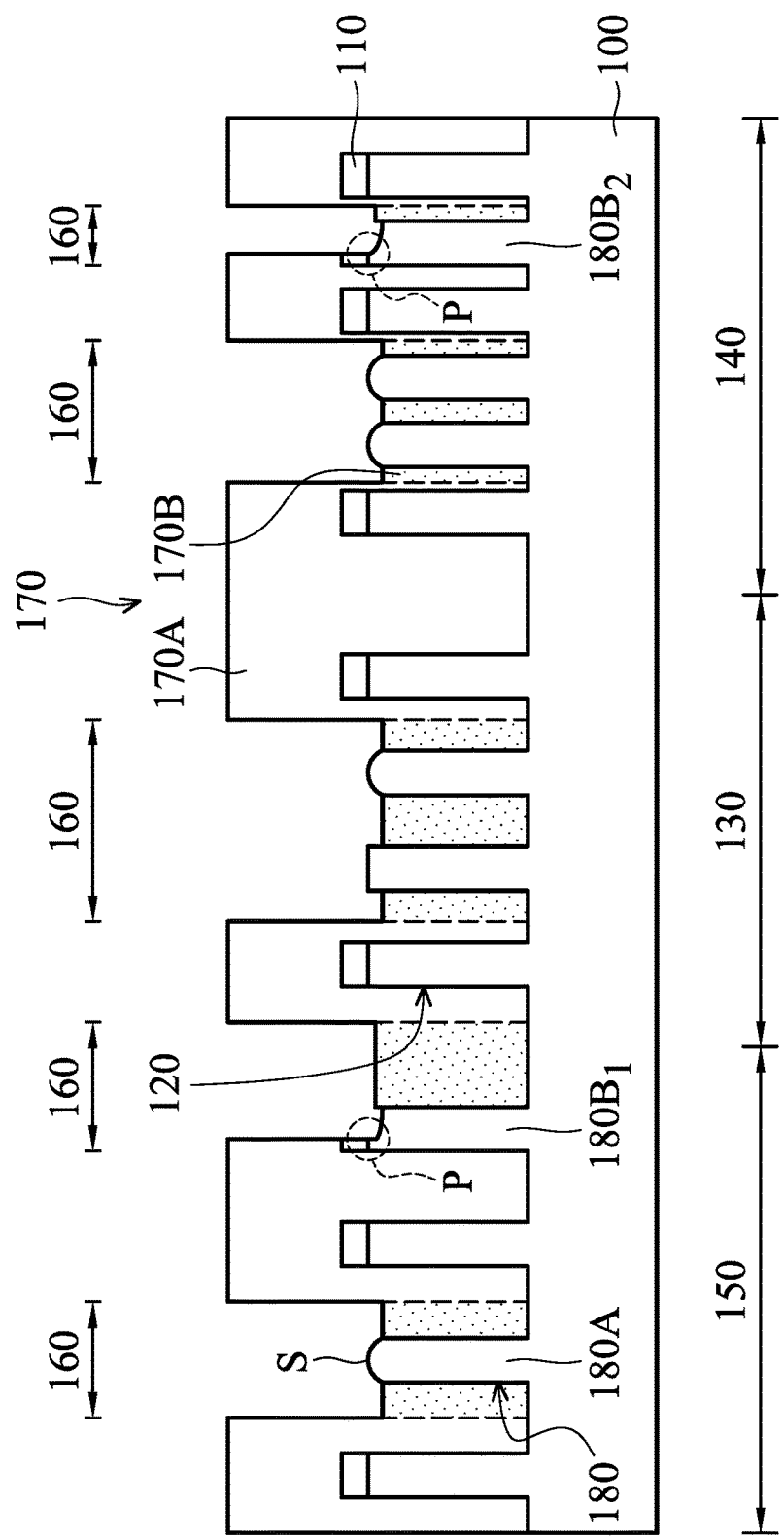

As shown in FIG. 1C, the upper portion of the second portions 170B and the patterned hard mask 110 in the fin-cut regions 160 are removed, in accordance with some embodiments. As a result, the top surface of the dummy fin structures 180 in the fin-cut regions 160 is exposed. In some embodiments, the exposed top surface of the fin structures 180 is flat. The sidewalls of the fin structures 180 are still covered or surrounded by the second portions 170B.

A first etching process is used to remove the upper portion of the second portions 170B and the patterned hard mask 110 in the fin-cut regions 160, in accordance with some embodiments. In some embodiments, the first etching process includes a dry etching process. In some embodiments, the dry etching process includes a plasma etching process. As mentioned above, the first portions 170A and the second portions 170B have different characteristics. In some embodiments, an etching rate of the first etching process to the second portions 170B is much higher than an etching rate of the first etching process to the first portions 170A. In some embodiments, an etching rate of the first etching process to the second portions 170B and the patterned hard mask 110 is much higher than an etching rate of the first etching process to the fin structures 180. Therefore, during the first etching process, the fin structures 180 are used as an etch stop layer. In some embodiments, the fin structures 180 are also partially etched by the first etching process.

In some embodiments, the conditions of the first etching process, such as the operation time, is fine-tuned such that the fin structures 180 are also partially etched. Therefore, it is ensured that the fin structures 180 are exposed without being covered by the patterned hard mask 110. In some embodiments, the portions of the fin structures 180 near the sidewall are etched faster than the center of the fin structures 180. As a result, the center of the etched fin structures 180 has a height greater than that of the sidewalls of the etched fin structures 180. In some embodiments, one of the etched fin structures (such as a fin structure 180A) gradually becomes higher along a direction from one sidewall towards the center of the fin structure 180A and gradually becomes higher along a direction from the other sidewall towards the center of the fin structures 180A. In other words, the top surface S of the fin structure 180A has a curved profile. The curved profile is decurved.

As mentioned above, when an OVL shift occurs during the exposure of the mask layer 170, the second portions 170B fail to cover the sidewalls of the corresponding fin structures 180. A portion of the patterned hard mask 110 may be embedded in the first portion 170A. As a result, the portion of the patterned hard mask 110 remains after the first etching process. When the fin structures 180 are partially etched during the first etching process, the remaining portion of the patterned hard mask 110 prevents a portion of the fin structures 180 underlying the remaining portion from being removed. Consequently, a fin structure (such as a fin structure 180B$_1$) with a protruding portion P is formed. The center of the fin structure 180B$_1$ has a height greater than that of one sidewall of the fin structure 180B$_1$. In some embodiments, the fin structure 180B$_1$ gradually becomes higher along a direction from one sidewall through the center of the fin structures 180B$_1$ towards the protruding portion P.

Loading effects may occur in the dense region 140 during the first etching process as a result of a highly concentrated arrangement. Consequently, in some embodiments, the fin structures 180 in the dense region 140 are slightly higher than that in the regular region 130 and the ISO region 150. In some embodiments, one of the fin structures 180 (such as a fin structure 180B$_2$) in the dense region 140 has a slightly longer protruding portion P than that in the regular region 130 and the ISO region 150.

Figure 1D:
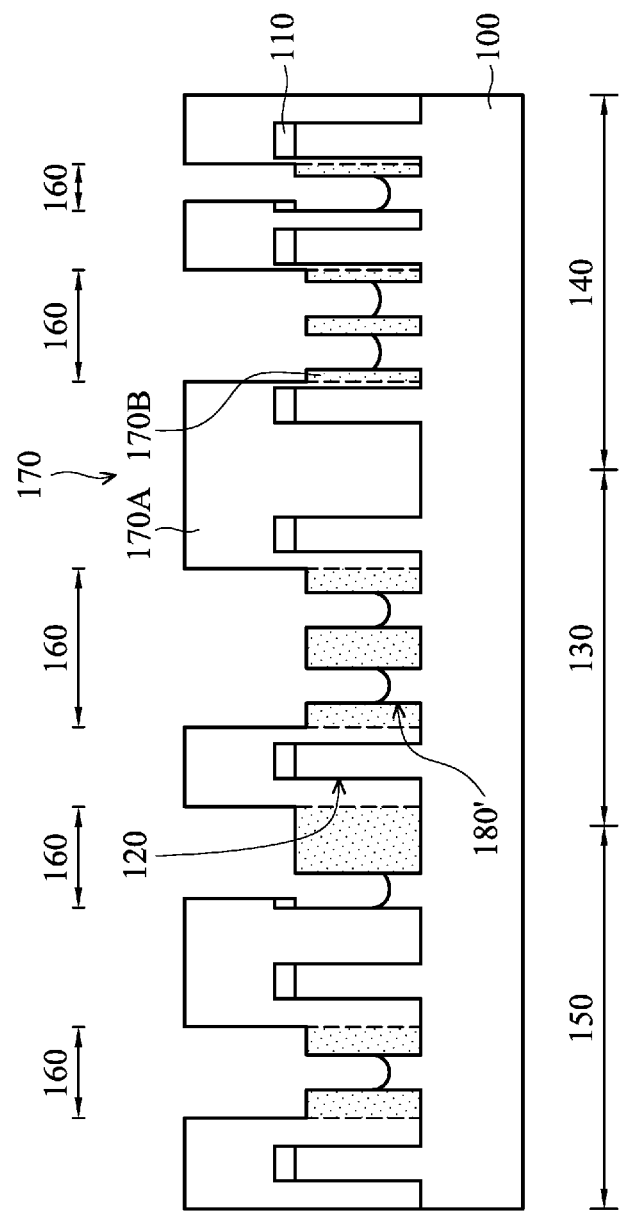

As shown in FIG. 1D, a portion of the fin structures 180 in the fin-cut regions 160 are further removed to form recessed fin structures 180', in accordance with some embodiments. In some embodiments, a second etching process is used to partially remove the fin structures 180 in the fin-cut regions 160. In some embodiments, the second etching process includes a dry etching process. The dry etching process may include a plasma etching process. In some embodiments, the operation power used for performing the second etching process is less than that used for performing the first etching process.

The second etching process uses an etchant having high etching selectivity to the fin structures 180, in accordance with some embodiments. In other words, an etching rate of the second etching process to the fin structures 180 is much higher than an etching rate of the second etching process to the mask layer 170. Therefore, the second etching process is a self-aligned etching process. In some embodiments, no photolithography process is performed between the first and second etching processes. An etching rate of the second etching operation to the fin structures 180 is higher than an etching rate of the first etching operation to the fin structures 180. In some embodiments, an etching rate of the second etching process to the second portions 170B is much higher than an etching rate of the second etching process to the first portions 170A.

In some embodiments, the etchant having high etching selectivity to the fin structures 180 includes HBr and Cl$_2$ or another suitable etching gas. The fin structures 180 are etched mainly by being reacted with the etching gas. The conditions of the second etching process, such as the flow rate of the etching gas, is fine-tuned to reduce the height of the fin structures 180. Loading effect can be reduced or eliminated during the second etching process. As a result, the recessed fin structures 180' in the regular region 130, the dense region 140 and the ISO region 150 have an uniform height, in accordance with some embodiments. In some other embodiments, the fin structures 180' in the ISO region 150 are slightly higher than the fin structures 180 in the regular region 130 and the dense region 140.

The center of the fin structures 180 is etched faster than the sidewalls of the fin structures 180, in accordance with some embodiments. As a result, the sidewalls of the recessed fin structures 180' surround a recess (or trench) over the fin structures 180'. The recesses will be described in more detail according to FIGS. 2 and 3.

The profile of the top surface of the dummy fin structures 180 is changed due to the second etching process, in accordance with some embodiments. Before the second etching process, the top surface of the dummy fin structures (the fin structures 180) is flat or has a decurved profile. After the second etching process, the top surface of the dummy fin structures (the fin structures 180') has a sunken profile as a result of the formation of the recess. In some embodiments, the decurved top surface S of the fin structures 180B$_1$ shown in FIG. 1C becomes sunken after the second etching process. In some embodiments, the protruding portion P of the fin structures 180B$_1$ and 180B$_2$ shown in FIG. 1C is removed after the second etching process.

Afterwards, the mask layer 170 is removed from the semiconductor substrate 100. In some embodiments, a remaining portion of the patterned hard mask 110 after the first etching process is removed together with the mask layer 170.

Figure 1E:
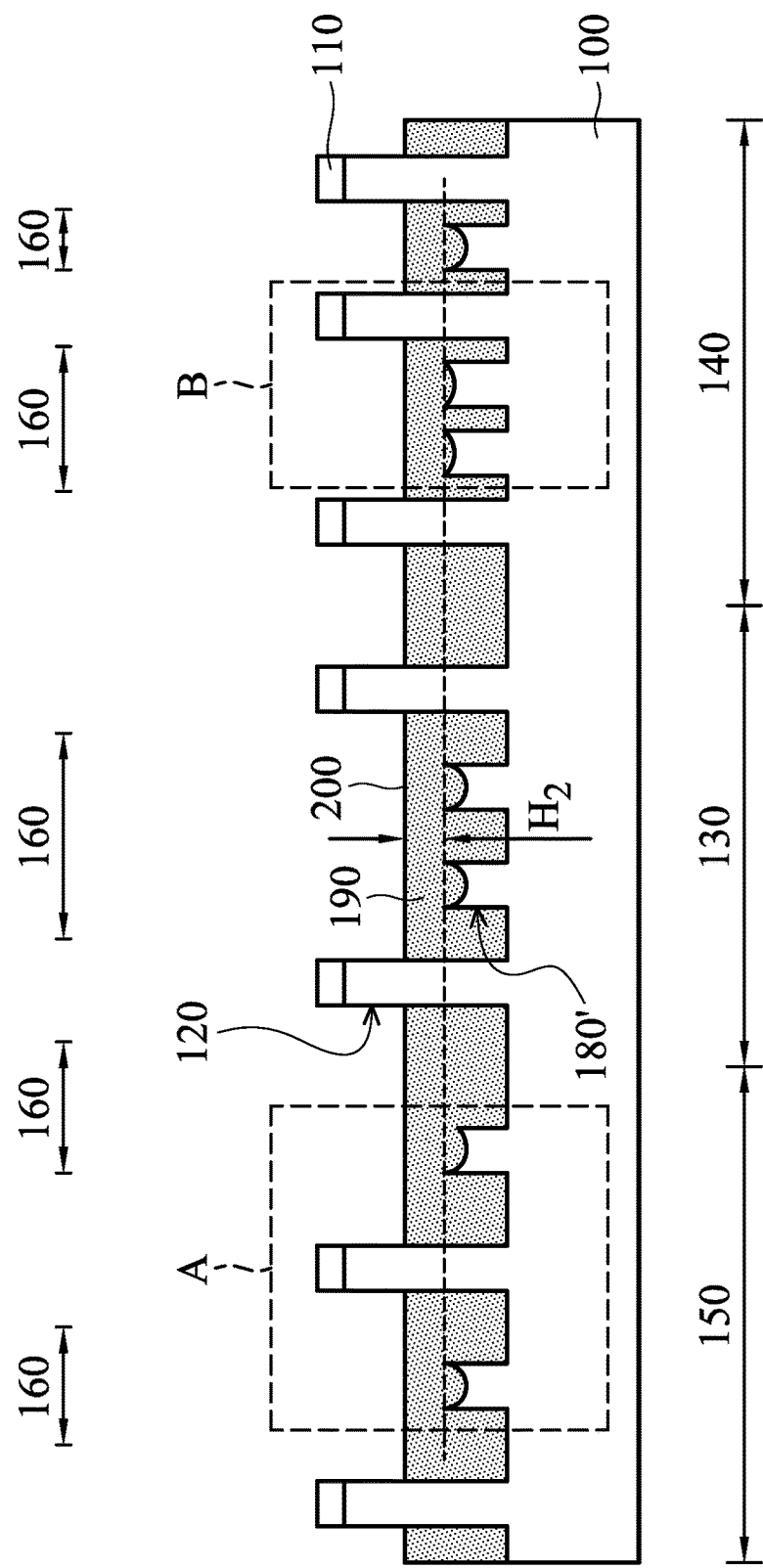

As shown in FIG. 1E, an isolation feature 190 is formed over the semiconductor substrate 100, in accordance with some embodiments. In some embodiments, the isolation feature 190 includes a shallow trench isolation (STI) feature, another suitable isolation feature, or a combination thereof.

In some embodiments, the isolation feature 190 has a multi-layer structure. In some embodiments, the isolation feature 190 is made of a dielectric material. The dielectric material includes silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation feature 190. Similarly, the STI liner may also be used to reduce crystalline defects at the interface between the fin structures 120 and 180' and the isolation feature 190.

In some embodiments, a dielectric material layer is deposited over the semiconductor substrate 100. The dielectric material layer covers the fin structures 120 and 180' and fills the recesses between the fin structures 120 and 180'. In some embodiments, the dielectric material layer is deposited using a chemical vapor deposition (CVD) process, a spin-on process, another applicable process, or a combination thereof. In some embodiments, a planarization process is performed to thin down the dielectric material layer until the patterned hard mask 110 over the fin structures 120 is exposed. In some embodiments, a planarization process is performed to thin down the dielectric material layer and remove the patterned hard mask 110 until the fin structures 120 are exposed. The planarization process may include a chemical mechanical polishing (CMP) process, a grinding process, an etching process, another applicable process, or a combination thereof.

Afterwards, the dielectric material layer is etched back to below the top of the fin structures 120. The fin structures 180' are still wrapped in the dielectric material layer. As a result, the isolation feature 190 is formed. In some embodiments, the lower portion of the fin structures 120 is surrounded by the isolation feature 190. The upper portion of the fin structures 120 protrudes from the isolation feature 190. In some embodiments, the top surface of the fin structures 180' is covered by the isolation feature 190. The fin structures 180' are embedded in the isolation feature 190. In some embodiments, a height difference H$_2$ between the isolation feature 190 and the fin structures 180' is in a range from about 20 nm to about 40 nm.

The partially removed fin structures 180' are used as a buffer feature, in accordance with some embodiments. The buffer feature mitigates stress accumulated in the isolation feature 190. As a result, the fin structures 120 partially buried in the isolation feature 190 are prevented from being damaged. In some embodiments, the fin structures 180' in the regular region 130, the dense region 140 and the ISO region 150 have an uniform height. Consequently, a better uniformity is achieved during the deposition of the isolation feature 190.

The patterned hard mask 110 over the fin structures 120 is removed after the formation of the isolation feature 190, in accordance with some embodiments. Various features will be formed over the semiconductor substrate 100. Some of the various features are electrically connected to the fin structures 120. The various features may include gate structures, contacts and another suitable feature.

The fin structures 180' are immersed in the isolation feature 190. Therefore, the subsequently formed feature is physically separated from the fin structures 180' by the isolation feature 190. In some embodiments, the fin structures 180' have no contact with subsequently formed conductive features, such as contacts. As a result, there is no electrical contact or connection between the fin structures 180' and the subsequently formed conductive feature. In some embodiments, a distance between the subsequently formed conductive feature and the fin structures 180' is in a range from about 20 nm to about 40 nm. A short circuiting is prevented between the fin structures 180' and the subsequently formed conductive feature. Therefore, the performance and reliability of the semiconductor device structure are significantly improved.

Figure 2:
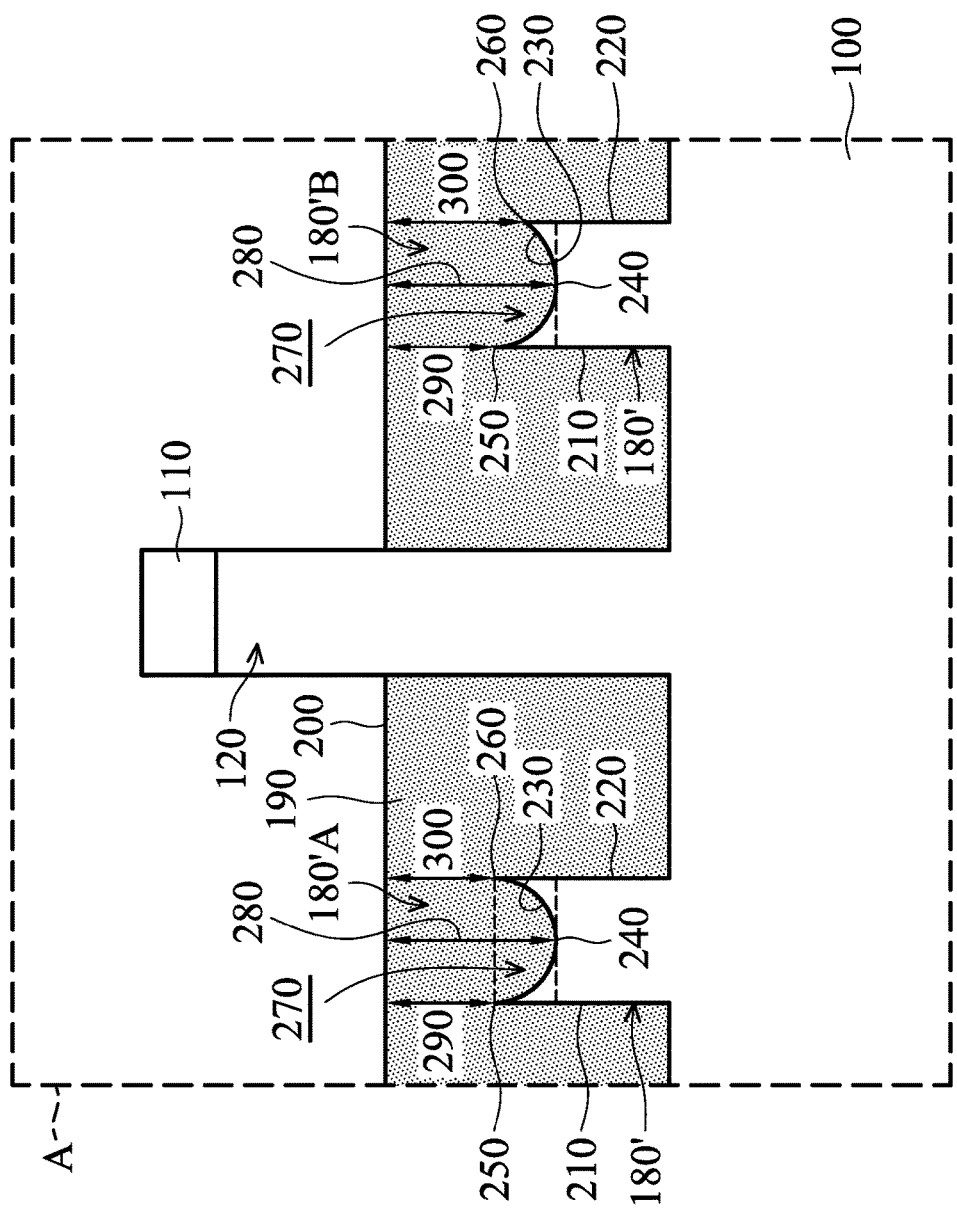
FIG. 2 is a cross-sectional view of a semiconductor device structure, in accordance with some embodiments.

FIG. 2 is an enlarged cross-sectional view of a semiconductor device structure, in accordance with some embodiments. In some embodiments, FIG. 2 shows an enlarged cross-sectional view of the region A shown in FIG. 1E. Two of the fin structures 180' (fin structures 180'A and 180'B) in the ISO region 150 are shown in FIG. 2. The fin structure 180'A has a first sidewall 210, a second sidewall 220 and a top surface 230. The first sidewall 210 is opposite to the second sidewall 220. The top surface 230 has a center 240, a first edge 250 and a second edge 260. The first edge 250 is the top of the first sidewall 210. The second edge 260 is the top of the second sidewall 220. In some embodiments, the distance between the center 240 and the first edge 250 is substantially the same as that between the center 240 and the second edge 260. In some other embodiments, the distance between the center 240 and the first edge 250 is different from that between the center 240 and the second edge 260.

In some embodiments, the first sidewall 210 has the same height as that of the second sidewall 220. Each of the heights of the first sidewall 210 and the second sidewall 220 is greater than that of the center 240. In some embodiments, the first sidewall 210 and the second sidewall 220 surround a recess 270 over the fin structure 180'A. The bottom surface of the recess 270 is the top surface 230. In some embodiments, the recess 270 has a curved profile. In some embodiments, the recess 270 has a symmetrical profile. In some other embodiments, the recess 270 has an asymmetrical profile.

In some embodiments, the fin structure 180'A gradually becomes shorter along a direction from the first sidewall 210 towards the center 240 and along a direction from the second sidewall 220 towards the center 240. In some embodiments, the fin structure 180'A gradually becomes shorter along a direction from the first edge 250 towards the center 240 and along a direction from the second edge 260 towards the center 240. The fin structure 180'A may gradually become shorter along a direction from the first sidewall 210 or the second sidewall 220 towards the center 240. In some embodiments, a height difference between the center 240 and the first sidewall 210 is in a range from about 1 nm to about 3 nm. In some embodiments, a height difference between the center 240 and the second sidewall 220 is in a range from about 1 nm to about 3 nm.

In some embodiments, a first distance 280 between the center 240 and the top surface 200 of the isolation feature 190 is greater than a second distance 290 between the first edge 250 and the top surface 200. In some embodiments, the first distance 280 is greater than a third distance 300 between the second edge 260 and the top surface 200. In some embodiments, the second distance 290 is substantially the same as the third distance 300. In some other embodiments, the second distance 290 and the third distance 300 are different from each other. In some embodiments, the second distance 290 and the third distance 300 are in a range from about 20 nm to about 40 nm. In some embodiments, the difference between the first distance 280 and the second distance 290 is in a range from about 1 nm to about 3 nm. The difference between the first distance 280 and the third distance 300 is in a range from about 1 nm to about 3 nm.

Many variations and/or modifications can be made to embodiments of the disclosure. In some embodiments, the first sidewall 210 and the second sidewall 220 of the fin structure 180' (such as the fin structure 180'B) have different heights. The heights of the first sidewall 210 and the second sidewall 220 may be different as a result of an OVL shift. As shown in FIG. 2, the heights of the first sidewall 210 and the second sidewall 220 of the fin structure 180'B are different. In some embodiments, the first sidewall 210 is higher than the second sidewall 220. The heights of the first sidewall 210 and the second sidewall 220 are greater than that of the center 240. Therefore, the first sidewall 210 and the second sidewall 220 surround a recess 270 over the fin structure 180'B. In some embodiments, the recess 270 has a curved profile. The recess 270 has an asymmetrical profile.

In some embodiments, the fin structure 180'B gradually becomes shorter along a direction from the first sidewall 210 towards the center 240 and along a direction from the second sidewall 220 towards the center 240. In some embodiments, the fin structure 180'B gradually becomes shorter along a direction from the first edge 250 towards the center 240 and along a direction from the second edge 260 towards the center 240. The fin structure 180'B may gradually become shorter along a direction from the first edge 250 or the second edge 260 towards the center 240.

Figure 3:
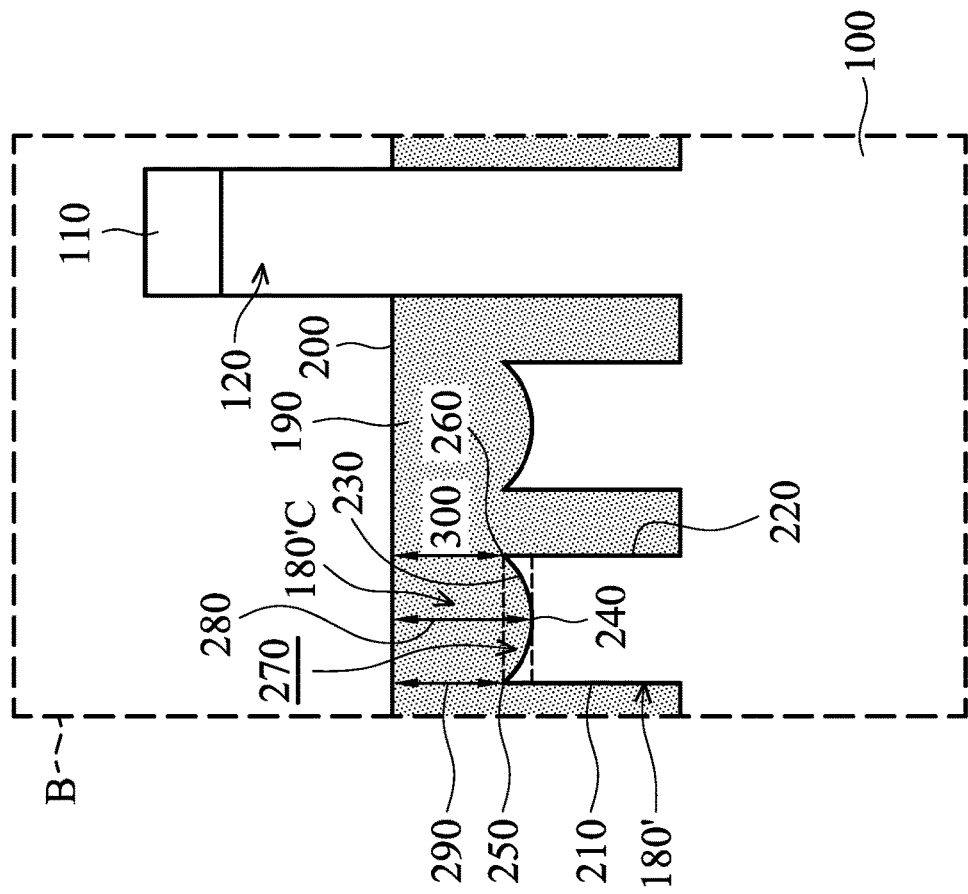
FIG. 3 is a cross-sectional view of a semiconductor device structure, in accordance with some embodiments.

FIG. 3 is an enlarged cross-sectional view of a semiconductor device structure, in accordance with some embodiments. In some embodiments, FIG. 3 shows an enlarged cross-sectional view of the region B shown in FIG. 1E. A fin structure 180'C in the dense region 140 is shown. Loading effects may occur in the dense region 140 during operations. As a result, a height difference between the center 240 and the first sidewall 210 or the second sidewall 220 of the fin structure 180'C is less than that of the fin structure 180'A in the ISO region 150. In some embodiments, the fin structure 180'C is slightly higher than the fin structure 180'A and the fin structure 180'B in the ISO region 150. In some embodiments, the recess 270 in the dense region 140 has a dimension less than that of the recess 270 in the ISO region 150.

In some embodiments, the heights of the first sidewall 210 and the second sidewall 220 of the fin structure 180' in the dense region 140 are different as a result of an OVL shift. The recess 270 over the fin structure 180' in the dense region 140 may have an asymmetrical profile.

Embodiments of the disclosure form a semiconductor device structure with a partially removed fin structure using a first etching operation and a second etching operation.

During the first etching operation, the fin structure is used as an etch stop layer. The second etching operation has a relatively high etching rate to the fin structure in comparison with the first etching operation. As a result, the partially removed fin structure is low enough to be completely embedded in the isolation feature. A short circuiting is prevented between the fin structure and conductive features subsequently formed over the isolation feature. Even if an OVL shift and/or loading effect occur before the second etching process, the induced defects are eliminated by the second etching process. Therefore, the performance and reliability of the semiconductor device structure are greatly improved.

In accordance with some embodiments, a method for forming a semiconductor device structure is provided. The method includes forming a first fin structure and a second fin structure over a semiconductor substrate, and forming a mask layer covering the first fin structure and the second fin structure. The method also includes performing a first etching operation using the second fin structure as an etch stop layer to partially remove the mask layer such that the etch stop layer protrudes from the mask layer after the first etching operation. The method further includes partially removing the second fin structure using a second etching operation after the first etching operation.

In accordance with some embodiments, a method for forming a semiconductor device structure is provided. The method includes forming a first fin structure and a second fin structure, and forming a mask layer covering the first fin structure and the second fin structure. The method also includes etching an upper portion of the mask layer by a first etching operation using the second fin structure as an etch stop layer. The method further includes forming a sunken top surface by etching a portion of the second fin structure through a second etching operation.

In accordance with some embodiments, a method for forming a semiconductor device structure is provided. The method includes forming a dummy fin structure and a fin structure, and partially removing the mask layer using the dummy fin structure as an etch stop layer such that the etch stop layer protrudes from the mask layer after the partial removal of the mask layer. The method also includes partially removing the dummy fin structure protruding from the mask layer and forming a recess over the dummy fin structure, wherein the recess is surrounded by a lower part of the mask layer, and wherein a center of the dummy fin structure is removed faster than a sidewall of the dummy fin structure during the partial removal of the dummy fin structure. The fin structure remains covered by the mask layer during and after the partial removal of the mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first fin structure and a second fin structure over a semiconductor substrate;
   forming a mask layer covering the first fin structure and the second fin structure;
   performing a first etching operation using the second fin structure as an etch stop layer to partially remove the mask layer such that the etch stop layer protrudes from the mask layer after the first etching operation;
   partially removing the second fin structure using a second etching operation after the first etching operation;
   removing the mask layer after the second etching operation; and
   forming an isolation feature over the semiconductor substrate to cover a top surface of the second fin structure after the mask layer is removed, wherein the first fin structure is protruded from the isolation structure.

2. The method for forming a semiconductor device structure as claimed in claim 1, further comprising:
   forming a hard mask over the first fin structure and the second fin structure, and the hard mask is covered by the mask layer, wherein a portion of the hard mask over the second fin structure is removed during the first etching operation, and the first fin structure remain covered by another portion of the hard mask during and after the first etching operation.

3. The method for forming a semiconductor device structure as claimed in claim 1, wherein sidewalls of the second fin structure is etched faster than a center of the second fin structure during the first etching operation.

4. The method for forming a semiconductor device structure as claimed in claim 1, wherein a center of the second fin structure is etched faster than sidewalls of the second fin structure during the second etching operation.

5. The method for forming a semiconductor device structure as claimed in claim 1, wherein a first height of the isolation structure directly above a center of the second fin structure is greater than a second height of the isolation structure directly above a sidewall of the second fin structure.

6. The method for forming a semiconductor device structure as claimed in claim 1, wherein a first etching rate of the second etching operation to the second fin structure is higher than a second etching rate of the first etching operation to the second fin structure and a third etching rate of the second etching operation to the mask layer.

7. The method for forming a semiconductor device structure as claimed in claim 1, further comprising:
   removing the mask layer after the second etching operation, wherein a top surface of the second fin structure is higher than a bottom surface of the first fin structure after removing the mask layer.

8. A method for forming a semiconductor device structure, comprising:
   forming a first fin structure and a second fin structure;
   forming a mask layer covering the first fin structure and the second fin structure;
   etching an upper portion of the mask layer by a first etching operation using the second fin structure as an etch stop layer; and
   forming a sunken top surface on a top surface of the second fin structure by etching a portion of the second fin structure through a second etching operation, wherein the sunken top surface has a middle portion and a peripheral portion, and the middle portion is lower than the peripheral portion.

9. The method for forming a semiconductor device structure as claimed in claim 8, wherein a first etching rate of the first etching operation to the mask layer is higher than a second etching rate of the first etching operation to the second fin structure.

10. The method for forming a semiconductor device structure as claimed in claim 8, further comprising:

irradiating the mask layer so that the mask layer is divided into an unirradiated portion and an irradiated portion before the first etching operation, wherein a first sidewall of the second fin structure is covered by the unirradiated portion, and a second sidewall of the second fin structure is covered by the irradiated portion.

11. The method for forming a semiconductor device structure as claimed in claim 10, wherein a height of the first sidewall of the second fin structure is greater than a height of the second sidewall of the second fin structure after the second etching operation.

12. The method for forming a semiconductor device structure as claimed in claim 8, wherein the second fin structure gradually becomes shorter from a center of the second fin structure to sidewalls of the second fin structure before the second etching operation.

13. The method for forming a semiconductor device structure as claimed in claim 8, wherein the first fin structure remains covered by the mask layer during and after the second etching operation.

14. The method for forming a semiconductor device structure as claimed in claim 8, further comprising:

removing the mask layer after the second etching operation; and forming an isolation feature over the semiconductor substrate to surround a lower portion of the first fin structure and to cover a top surface of the second fin structure after the mask layer is removed, wherein the first fin structure is covered by a first hard mask after the isolation feature is formed.

15. A method for forming a semiconductor device structure, comprising:

forming a dummy fin structure and a fin structure;

partially removing a mask layer using the dummy fin structure as an etch stop layer such that the etch stop layer protrudes from the mask layer after the partial removal of the mask layer; and partially removing the dummy fin structure protruding from the mask layer and forming a recess over the dummy fin structure, wherein the recess is surrounded by a lower part of the mask layer, and wherein a center of the dummy fin structure is removed faster than a sidewall of the dummy fin structure during the partial removal of the dummy fin structure, wherein the fin structure remains covered by the mask layer during and after the partial removal of the mask layer.

16. The method for forming a semiconductor device structure as claimed in claim 15, wherein after the partial removal of the dummy fin structure, the dummy fin structure comprises a first sidewall, a second sidewall opposite to the first sidewall, and a center between the first sidewall and the second sidewall, and wherein the dummy fin structure gradually becomes shorter from the first sidewall and the second sidewall to the center.

17. The method for forming a semiconductor device structure as claimed in claim 16, wherein a height of the first sidewall is different from a height of the second sidewall.

18. The method for forming a semiconductor device structure as claimed in claim 15, further comprising removing the lower part of the mask layer after the formation of the recess such that a sidewall of the dummy fin structure is exposed.

19. The method for forming a semiconductor device structure as claimed in claim 15, further comprising filling the recess with an isolation feature, wherein the dummy fin structure comprises a first sidewall and a second sidewall opposite to the first sidewall, and the recess extends from the first sidewall to the second sidewall.

20. The method for forming a semiconductor device structure as claimed in claim 19, wherein the isolation feature has a curved bottom surface directly above the dummy fin structure.

\* \* \* \* \*